(12) United States Patent
Wetzel et al.

(10) Patent No.: US 7,639,029 B2
(45) Date of Patent: Dec. 29, 2009

(54) HEAT SINK PEDESTAL WITH INTERFACE MEDIUM CHAMBER

(75) Inventors: Stephen Aloysius Wetzel, San Diego, CA (US); Thanh Trieu, San Diego, CA (US)

(73) Assignee: Delta Design, Inc., Poway, CA (US)

( * ) Notice: Subject to any disclaimer, the term of this patent is extended or adjusted under 35 U.S.C. 154(b) by 171 days.

(21) Appl. No.: 11/331,217

(22) Filed: Jan. 13, 2006

(65) Prior Publication Data

US 2006/0158854 A1 Jul. 20, 2006

Related U.S. Application Data

(60) Provisional application No. 60/643,602, filed on Jan. 14, 2005, provisional application No. 60/661,151, filed on Mar. 14, 2005.

(51) Int. Cl.
*G01R 31/02* (2006.01)
(52) U.S. Cl. .................. 324/760; 324/158.1
(58) Field of Classification Search .................. None
See application file for complete search history.

(56) References Cited

U.S. PATENT DOCUMENTS

| | | | |
|---|---|---|---|
| 4,839,587 A * | 6/1989 | Flatley et al. ............ | 324/761 |
| 5,821,505 A | 10/1998 | Tustaniwskyj et al. | |
| 6,389,225 B1 | 5/2002 | Malinoski et al. | |
| 6,447,322 B1 | 9/2002 | Yan et al. | |
| 6,476,627 B1 | 11/2002 | Pelissier et al. | |
| 6,489,793 B2 | 12/2002 | Jones et al. | |
| 6,570,398 B2 * | 5/2003 | Murphy et al. ............ | 324/755 |
| 2003/0057980 A1 | 3/2003 | Murphy et al. | |

OTHER PUBLICATIONS

IBM Technical Disclosure Bulletin, IBM Corp., "Interposer for Tab Thermal Control," vol. 31, No. 6, Nov. 1988, pp. 364-366.
Xie et al., "Packaging the Itanium Microprocessor," 2002 Proceedings 52$^{nd}$, Electronic Components and Technology Conference, May 28-31, 2002, pp. 583-589.
Mok, "Thermal Management of Silicon-Based Multichip Modules," Semiconductor Thermal Measurement and Management Symposium, Feb. 1994, pp. 59-63.

* cited by examiner

*Primary Examiner*—Vinh P Nguyen
(74) *Attorney, Agent, or Firm*—Foley & Lardner LLP

(57) ABSTRACT

A heat sink pedestal device allows for the use of generic thermal units such as heat sinks. An interposer configured to fit a specific device under test is mounted to a retainer. The retainer firmly holds the interposer in position. In addition, the retainer may be mounted to a thermal unit. An interface sealant with a diameter less than that of the interposer, creating the perimeter of an interface medium chamber, is positioned at the periphery of the interposer between the interposer and the thermal unit. Interface material, having high thermal conductive properties, is positioned within the interface sealant. The interface medium chamber provides a high thermally conductive interface between the interposer and the thermal unit. In addition, the heat sink pedestal device minimizes customization because it allows a single heat sink or thermal unit assembly to be used to accommodate a wide range of unit sizes.

22 Claims, 10 Drawing Sheets

HEAT SINK PEDESTAL WITH INTERFACE MEDIUM CHAMBER

CROSS-REFERENCE TO RELATED PATENT APPLICATIONS

This instant application claims priority to and benefit of U.S. Provisional Application No. 60/643,602 filed Jan. 14, 2005 and U.S. Provisional Application No. 60/661,151 filed Mar. 14, 2005, the disclosures of which are incorporated by reference herein in their entirety.

BACKGROUND OF THE INVENTION

The present invention relates generally to the field of thermal control and/or conditioning of a device under test, such as a semiconductor wafer or die undergoing electrical testing, or other devices that may be in use or undergoing testing. More particularly, it relates to an apparatus and method for thermal control and/or conditioning of such device.

Various techniques have been developed to maintain the temperature of a semiconductor device at or near a predetermined set point temperature. For example, such systems and methods are described in U.S. Pat. No. 6,489,793, U.S. Pat. No. 6,476,627, U.S. Pat. No. 6,389,225 and U.S. Pat. No. 5,821,505, all herein incorporated by reference in their entireties.

In application, the area available to thermally condition a device varies from application to application. Units typically are thermally conditioned using custom tooling, particularly with respect to heat sink assemblies used to maintain temperature. Thus, using conventional products, a user wishing to conduct testing on a device must acquire a custom-made heat sink assembly created to match the specifications of the device under test. In turn, the user wishing to test devices having different specifications must incur additional costs in purchasing or creating several custom heat sink assemblies. In addition, a user will incur additional time needed to install and setup a custom-made heat sink assembly for each different device under test, which results in longer development cycles.

Therefore, there is a need for a device that minimizes the level of customization needed to test different devices. Specifically a device that allows a generic heat sink assembly to be used to thermally condition a wide range of devices having different physical properties.

SUMMARY OF THE INVENTION

According to one embodiment of the present invention, a heat sink pedestal device for use with a thermal unit comprises an interposer, having a pedestal configured to contact a unit under test, an interface sealant, for defining an interface medium chamber, positioned between the interposer and the thermal unit; an interface material located within the interface medium chamber; and a retainer, holding the interposer and mounted to the thermal unit, having a retainer opening for allowing the pedestal to extend through the retainer opening to contact the unit under test.

According to a feature of the present invention, the pedestal has a raised contact surface with sloped edges for contacting the device under test and the interposer is composed of material having a high thermal conductivity.

According to another feature of the present invention, the interface sealant is fastened to a surface of the thermal unit and the interface material is compressed between the thermal unit and the interposer and inside the interface sealant.

According to still another feature of the present invention, the interface sealant is fastened to a surface of the interposer opposite the pedestal and the interface material is compressed between the thermal unit and the interposer and inside the interface sealant.

According to yet another feature of the present invention, the interface sealant is composed of a pliant material and the interface material is composed of a thermal compound.

According to another feature of the present invention, the retainer comprises a mating surface for retaining the interposer in the Z-axis and the interposer is securely retained in the X & Y axis by a precision fit between the retainer opening and a plurality of bosses located on the interposer.

According to yet another feature of the present invention the heat sink pedestal device further comprises a stop plate having a stop plate opening, mounted to a chuck assembly, whereby the retainer and pedestal extend through the stop plate opening.

According to still another feature of the present invention, the heat sink pedestal device comprises an interposer having a pedestal configured to contact a unit under test, and a variable gland, positioned on a periphery of an interposer surface opposite the pedestal; an interface sealant positioned in the variable gland to define an interface medium chamber between the interposer and the thermal unit, an interface material located within the interface medium chamber; and a retainer, holding the interposer in compression against the thermal unit, having a retainer opening for allowing the pedestal to extend through the retainer opening to contact the unit under test.

According to yet another feature of the present invention, the interface sealant is an O-ring.

According to another feature of the present invention, a method of conducting thermal cooling of a device comprises providing a device to be cooled; providing an interposer, having a pedestal configured to contact the device to be cooled, providing an interface medium chamber, positioned between the interposer and the thermal unit; and providing a retainer, holding the interposer in compression against the thermal unit, having a retainer opening for allowing the pedestal to extend through the retainer opening to contact the device to be cooled.

It is to be understood that both the foregoing general description and the following detailed description are exemplary and explanatory only and are not restrictive of the invention as claimed. These and other features, aspects, and advantages of the present invention will become apparent from the following description, appended claims and the accompanying exemplary embodiments shown in the drawings, which are briefly described below.

DETAILED DESCRIPTION OF THE PREFERRED EMBODIMENTS

Embodiments of the present invention will be described below with reference to the accompanying drawings. It should be understood that the following description is intended to describe exemplary embodiments of the invention, and not to limit the invention.

A heat sink pedestal device according to the invention can be used in various thermal control systems and applications. Preferably it is applied in a system that controls the temperature of a device under test (DUT), such as a semiconductor die or wafer. Such a system is described in U.S. Pat. No. 5,821,505, the disclosure of which is incorporated by reference. As described below, preferably, the heat sink pedestal device according to the invention is provided between the DUT and the thermal unit. As described in U.S. Pat. No. 5,821,505, the thermal unit comprises a heat sink and a thin film heating element disposed on the surface of the heat sink. A thermal control unit controls the heater based on the temperature of the DUT as measured by a sensor to maintain a constant set point temperature.

Figure 1:
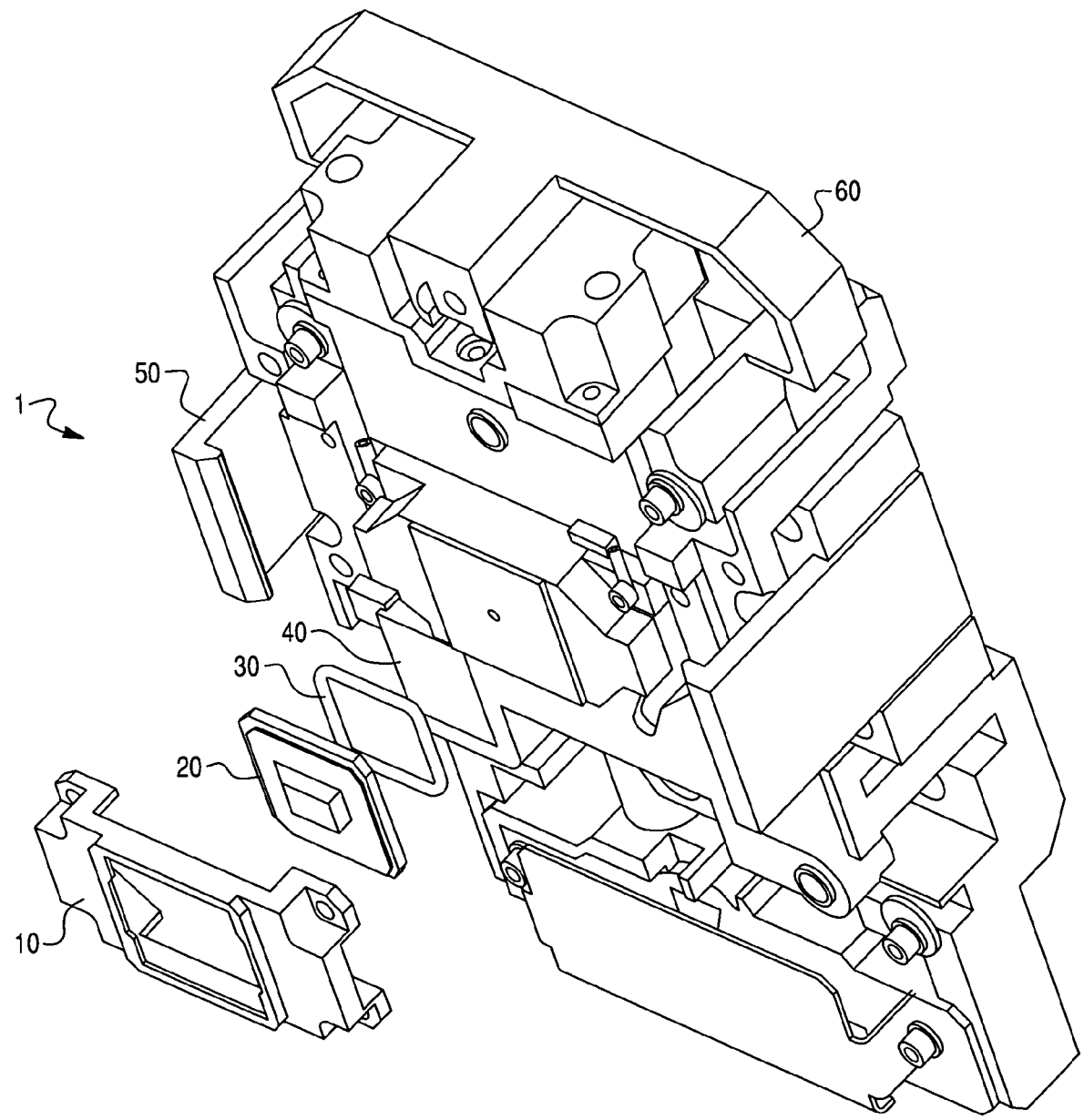
FIG. 1 is a perspective view of the heat sink pedestal device, prior to assembly, according to one embodiment of the present invention.

A perspective view of a heat sink pedestal device 1 according to one embodiment of the present invention is shown in FIG. 1. Specifically, FIG. 1 shows the heat sink pedestal device 1 prior to assembly and installation. According to one embodiment of the invention, the heat sink pedestal device comprises a retainer 10, an interposer 20, an interface sealant 30 and interface material 40. Generally, these components are mounted to a thermal unit 50, which in turn is generally connected to a chuck assembly 60. In addition, a stop plate 70 (not shown in FIG. 1) may be mounted over the retainer 10. A discussion of the installation and assembly process will follow the description of each component.

Figure 2A:
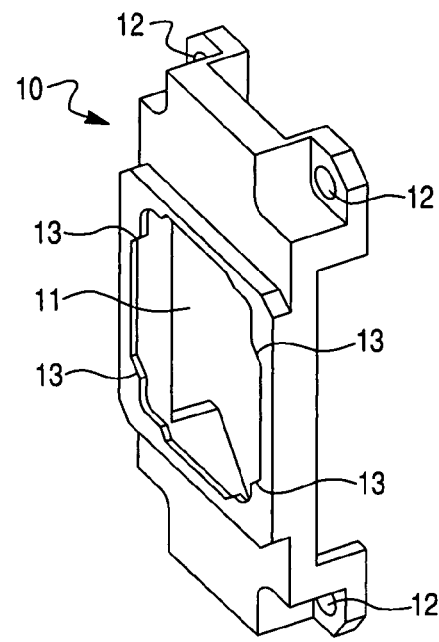
FIG. 2A is a perspective view of a retainer for a heat sink pedestal device.

FIG. 2A is a perspective view of the retainer 10 according to one embodiment of the invention. The retainer 10 has a retainer opening 11 and a plurality of screw holes 12. The retainer 10 may be composed of any suitable material such as metal. Preferably, the retainer 10 is made from a machined low thermal conductivity metal, such as stainless steel. As illustrated in FIGS. 2A and 2D-2I, the retainer 10 has a plurality of mating surfaces 13 at the periphery of the retainer opening 11. The mating surfaces 13 are configured to encounter the surface of the interposer 20. In addition, as shown in FIGS. 2H and 2I the retainer 10 also has depth at the retainer opening 11. This depth allows for an interposer 20 to rest firmly in place in the retainer opening 11. Moreover, the mating surfaces 13 act to retain the interposer 20 in the z-axis. Accordingly, the retainer 10 prevents the interposer 20 from moving in a vertical position and accurately positions the interposer in a horizontal position.

Figure 3A:
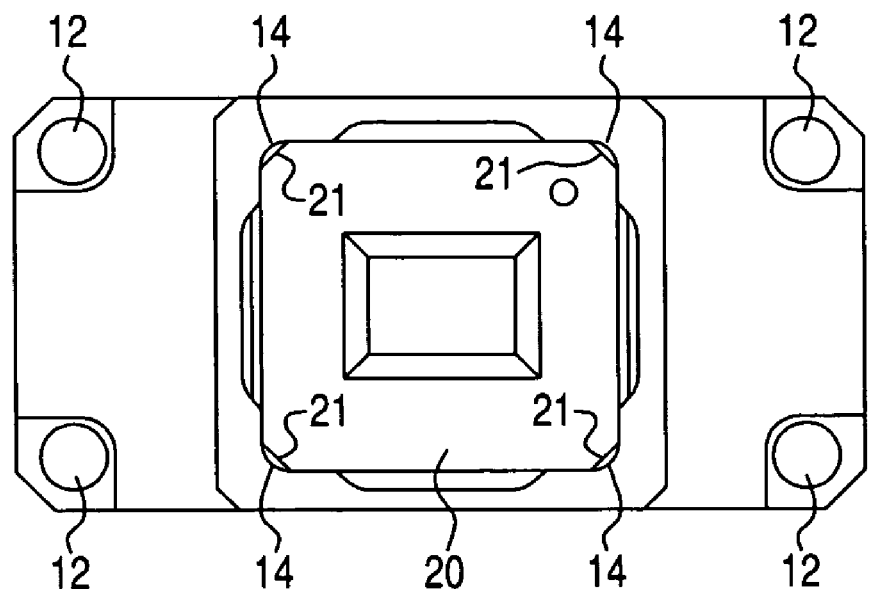
FIG. 3A is a front view of an interposer at rest in a retainer according to one embodiment of the present invention.
Figure 3B:
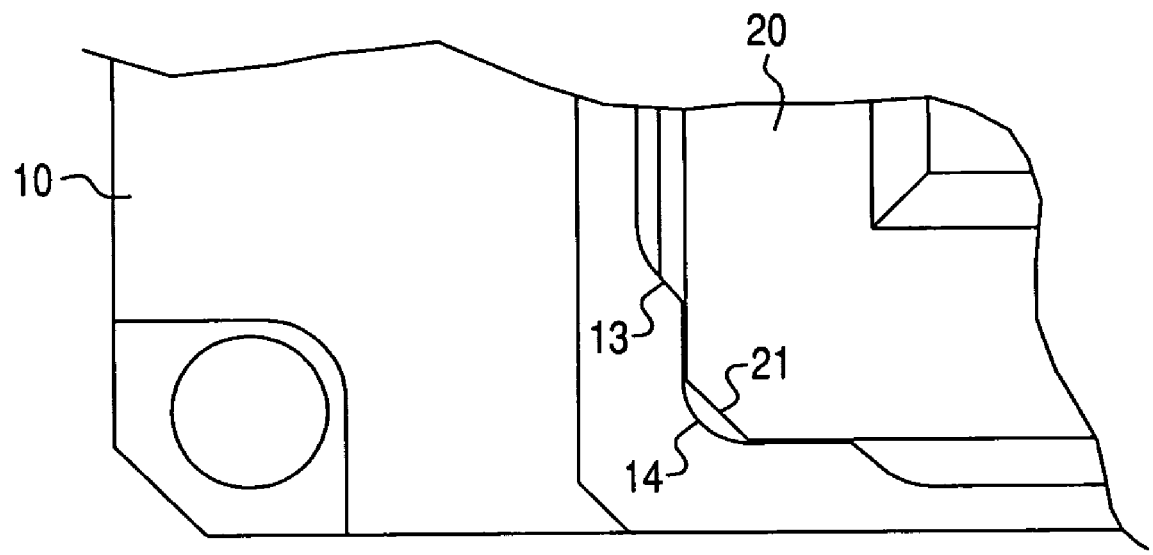
FIG. 3B is an enlarged view of an interposer at rest in a retainer.

Similarly, according to one embodiment of the invention, the retainer 10 has a plurality of mating edges 14. As shown in FIGS. 3A-B, the retainer opening 11 has a plurality of mating edges 14 configured to retain and secure the interposer 20 in the x-axis and y-axis. As will be described later, the mating edges 14 act in conjunction with a plurality of bosses 21 on the interposer 20 to securely hold the interposer 20 in position. Accordingly, the retainer's 10 mating edges 20 help prevent the interposer 20 from moving in a horizontal position.

Figure 4C:
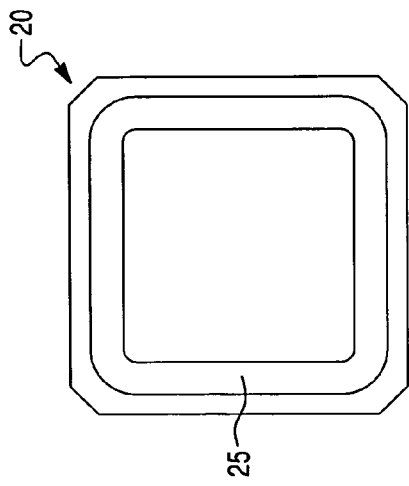
FIG. 4C is a back view of an interposer for a heat sink pedestal device according to one embodiment of the present invention.
Figure 4B:
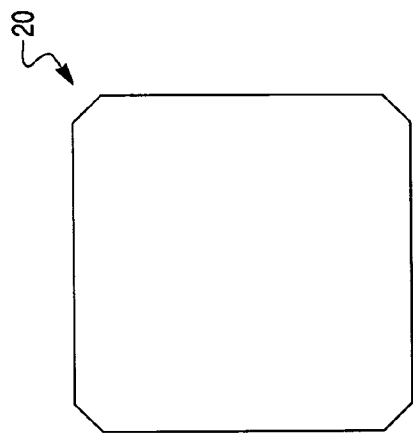
FIG. 4B is a back view of an interposer for a heat sink pedestal device according to one embodiment of the present invention.
Figure 4E:
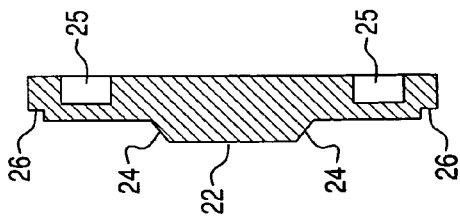
FIG. 4E is a sectional view of an interposer for a heat sink pedestal according to another embodiment of the present invention.
Figure 4A:
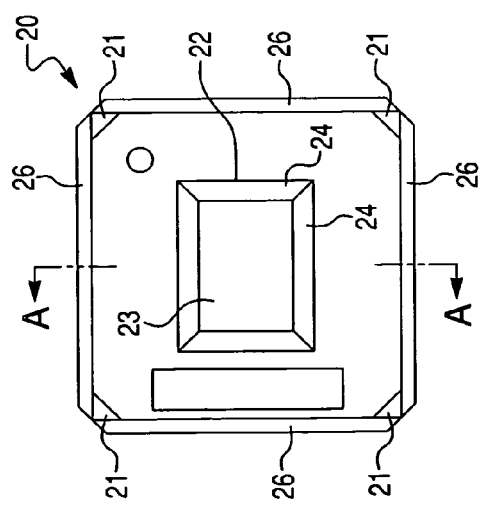
FIG. 4A is a front view of an interposer for a heat sink pedestal device.
Figure 4D:
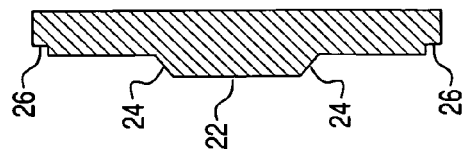
FIG. 4D is a sectional view of the interposer according to one embodiment of the present invention.

FIG. 4A shows the top of an interposer 20 according to one embodiment of the present invention. Generally, the interposer 20 can be made of any suitable material. Preferably, the interposer 20 is composed of a highly thermally conductive material, such as metal or metal-matrix composites, for example copper, silver, or diamond. The size and dimensions of the interposer 20 can be increased or decreased as required, however the interposer performs best when designed for an optimal thickness. An optimal thickness is one that balances a need for heat spreading with a need to minimize the thermal mass of the interposer. At its periphery, the interposer 20 has a plurality of bosses 21 that fit with the mating edges 14 of the retainer 10 to secure the interposer 20 in the X and Y-axis. In addition, at its periphery, the interposer 20 has a stepped edge 26. The stepped edge 26 fits with the mating surfaces 13 of the retainer 10 to secure the interposer in the z-axis.

According to one embodiment of the invention, the interposer 20 also has a pedestal 22 at its center. The pedestal has a contact surface 23, which is in contact with the unit under test (not shown), such as a semiconductor wafer or die. Preferably, the contact surface 23 of the pedestal 22 is raised and has a plurality of sloped edges 24. The sloped edges help spread the heat into the interposer, however it will be appreciated that the pedestal may have vertical edges if there are over-riding mechanical design requirements for the chuck. Preferably, according to one embodiment of the present invention, the pedestal 22 has a size that matches that of the device being thermally conditioned. For example, the pedestal 22 can be made to have about the same contact area or size (within a desired range, such as 1 to 30 percent) as a semiconductor die undergoing testing. According to one embodiment of the invention, the surface area of the raised contact surface 23 is configured to correspond to the surface area of the device under test. According to still another embodiment of the invention, the surface area of the raised contact surface 23 is configured to correspond to less than one hundred percent of the surface area of the device under test, such that the edges of the device under test are avoided and the contact area is otherwise maximized.

The interposer 20 with pedestal 22 reduces the temperature rise of a device under test. The reduction in temperature rise is directly proportional to the power density of the device under test. The pedestal 22 causes the interposer 20 to not come into contact with the edge of a device under test, thus avoiding stress concentrations which could cause the silicon to chip or crack. In turn, the device under test will have a slightly higher temperature due to the reduced contact area than it would if the interposer 20 did not have a pedestal 22 but, the device under test will also be slightly more responsive, meaning the rate at which it processes instructions will be faster, due to its lower temperature.

FIG. 4B shows the bottom of an interposer 20 according to one embodiment of the present invention. The back of the interposer is flat and its surface is finished to optimize its thermal and mechanical properties upon contact with an interface sealant 30 and an interface material 40 (not shown in FIG. 4B).

FIG. 4C shows the bottom of an interposer 20 according to one embodiment of the present invention. Here, the interposer 20 has a variable gland 25 at the outer periphery of the interposer 20. The variable gland 25 is configured to receive and hold an interface sealant 30 along the periphery of the interposer 20. As shown in FIG. 4E, the variable gland 25 creates a groove or cavity in the interposer 20. As will be described later, the variable gland 25 dictates the position of the interface sealant 30 and interface material 40 in relation to the bottom surface of the interposer 20.

An interface sealant 30, according to one embodiment of the invention is shown in FIG. 1. Generally, the interface sealant 30 is configured and shaped so that it forms an outer perimeter on the bottom surface of the interposer 20. The purpose of the interface sealant 30 is to prevent the leakage of interface material 40 out of the interface medium chamber 80 formed by the interposer 20, interface sealant 30 and thermal unit 50. Another purpose of the interface sealant 30 is to prevent the interface material 40 from drying out or changing its thermal properties, or at least to significantly extend the time it takes for its thermal properties to degrade. The interface sealant 30 is characterized in that it demonstrates a wide range of thermal stability. In addition, the interface sealant 30 may exhibit adhesive properties. Further, the interface sealant 30 may be made from a solid and rigid material or from a pliant, gel-like material. According to another embodiment of the invention, the interface sealant 30 is an O-ring. Preferably, the O-ring is composed of a silicone polymer. An O-ring is used to retain the interface material and/or interface fluid. The O-ring does not have to be perfectly round and preferably has a similar shape to that of the interposer 20.

FIG. 1 shows interface material 40 according to one embodiment of the invention. The interface material can generally be any material with high thermally conductive properties in any form including a solid, paste, gel, foil, film, liquid or grease. For example, the interface material may be indium, solder, Gelvet, or other commercially available interface compound. Alternatively, the material may be thermally conductive fluid such as propylene glycol/water or thermal grease. The preferred thermal grease is high-thermal-conductivity grease, such as that achieved with high thermal conductivity filler material such as silver or diamond. Alternatively, according to one embodiment of the invention the interface material may be composed of both a solid and a liquid. When thermal fluid is used, the fluid can be supplied through the center of the thermal unit 50 into the interface medium chamber 80. The amount and location of the interface material 40 can be controlled by the user. This allows for easy install and uninstall of the interposer 20.

The purpose of the interface material 40 is to fill air pockets and gaps between the interposer 20 and the thermal unit 50. For a thermal unit 50 to operate correctly, intimate thermal contact is required between it and the interposer 20. At the microscopic level, the interposer 20 and the surface of the thermal unit 50 may be separated by interstitial layer of air due to microscopic hills and valleys on the surface if the interposer 20 and the thermal unit 50. The air between the interposer 20 and thermal unit 50 conducts heat poorly and thus significantly degrades the performance. Interface material displaces the air with microscopic particles of high-thermal conductivity material and improves the heat transfer. Here, the interface material 40 is compressed between the interposer 20 and thermal unit 50 to ensure maximum thermal conduction between the thermal unit 50 and interposer 20.

It will be appreciated that the thermal unit may have different configurations than that illustrated. Generally, the thermal unit in the described embodiment functions to remove heat from a device under test or to add heat so as to maintain the temperature of the device positioned on the surface of the pedestal at or near a predetermined set point.

Figure 5A:
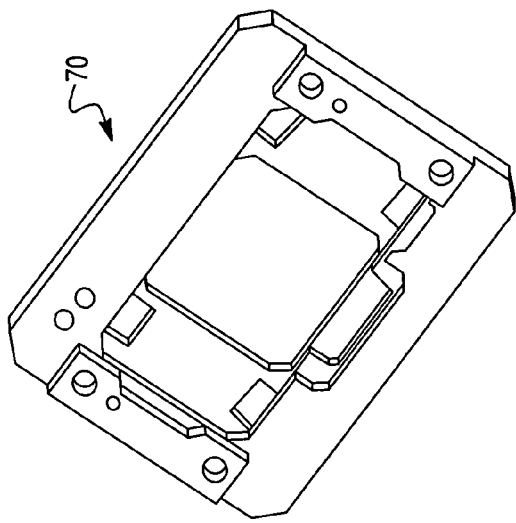
FIG. 5A is a front perspective view of a stop plate for a heat sink pedestal device according to one embodiment of the present invention.
Figure 5B:
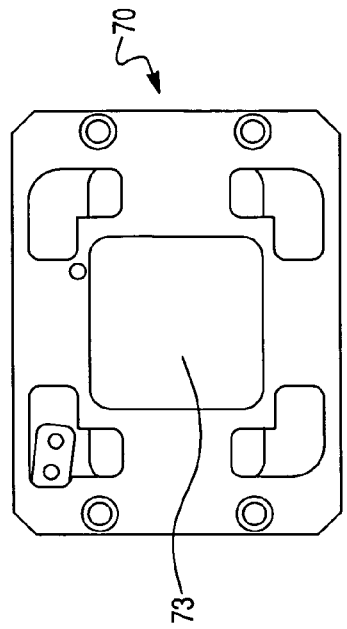
FIG. 5B is a back perspective view of a stop plate for a heat sink pedestal device according to one embodiment of the present invention.
Figure 5C:
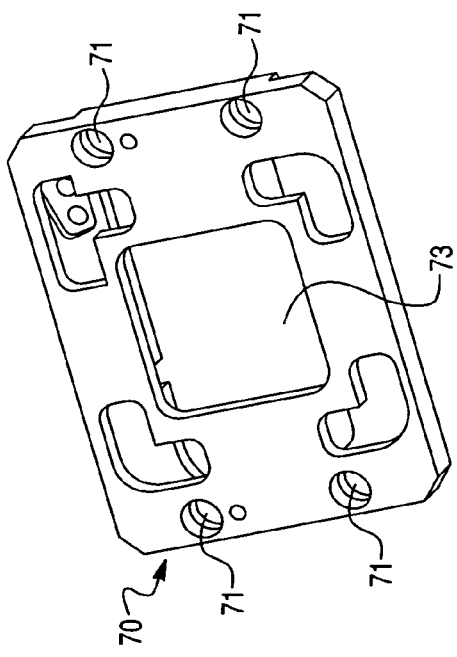
FIG. 5C is a front view of a stop plate for a heat sink pedestal device according to one embodiment of the present invention.
Figure 5D:
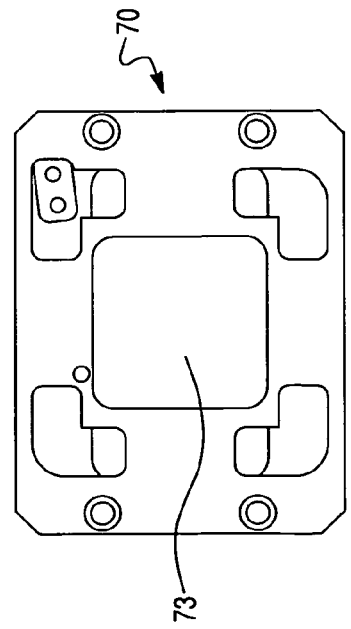
FIG. 5D is a back view of a heat sink pedestal device according to one embodiment of the present invention.
Figure 6:
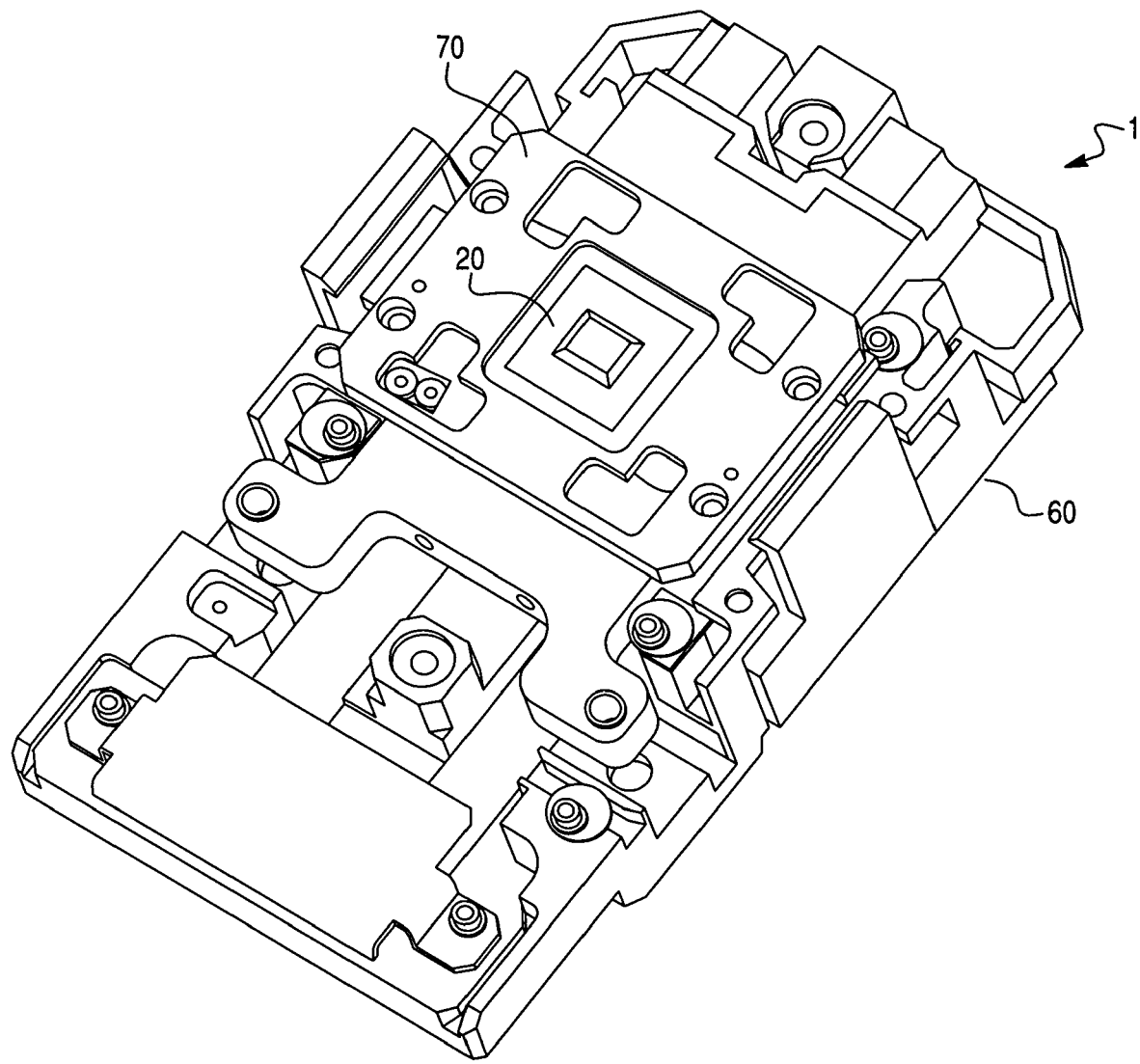
FIG. 6 is a perspective view of an assembled heat sink pedestal device attached to a thermal unit and chuck assembly.
Figure 7A:
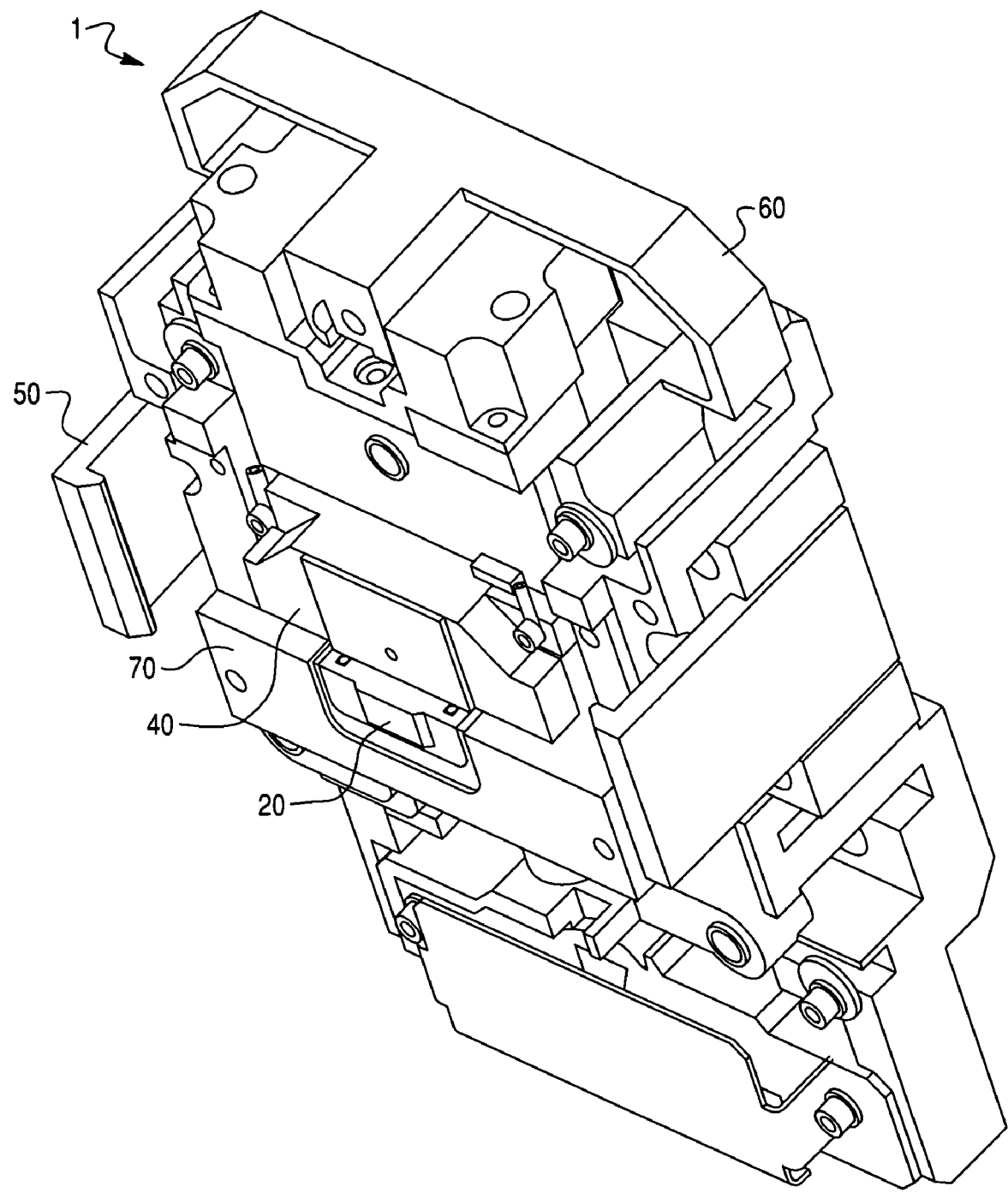
FIG. 7A is a perspective cut-away view of an assembled heat sink pedestal device attached to a thermal unit and a chuck assembly according to one embodiment of the present invention.
Figure 7B:
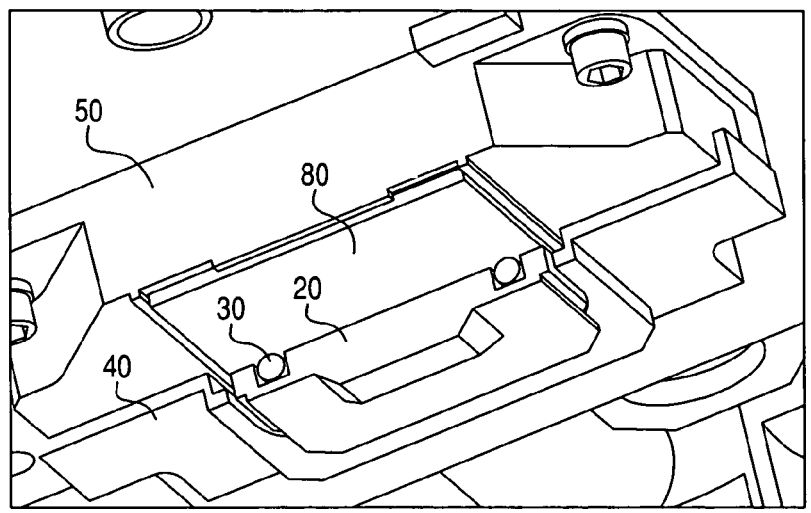
FIG. 7B is an enlarged view of FIG. 7A.
Figure 8A:
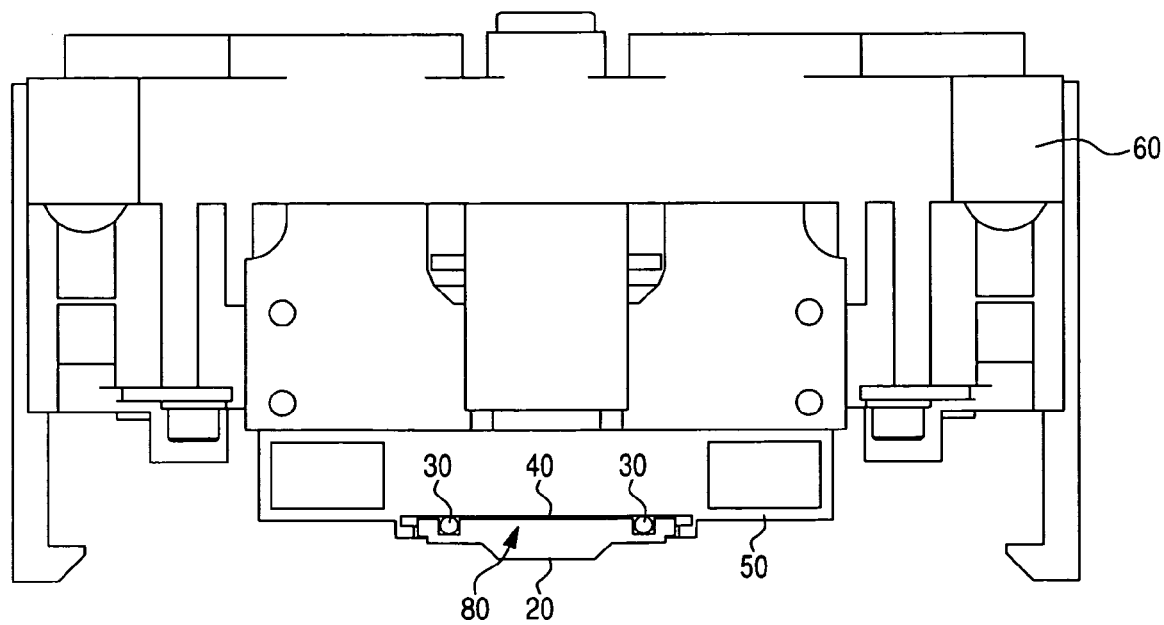
FIG. 8A is a cut-away view of a heat sink pedestal device attached to a thermal unit and a chuck assembly.
Figure 8B:
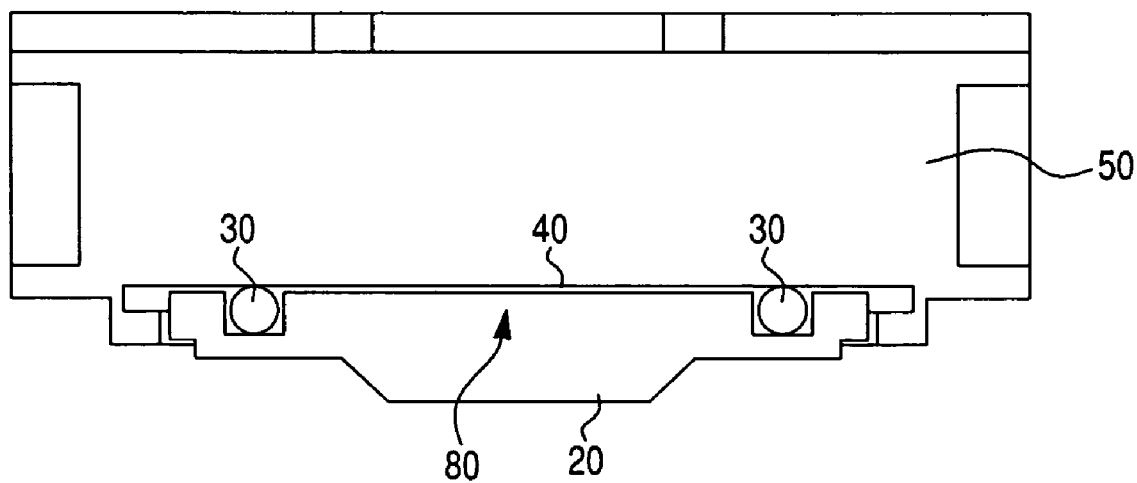
FIG. 8B is an enlarged cut-away view of a heat sink pedestal device according to one embodiment of the present invention.

FIG. 5A shows a stop plate 70 according to one aspect of the invention. Generally, the stop plate 70 is bolted to the chuck (not shown). Thermal unit 50, retainer 10, interposer 20 and interface medium chamber 80 are bolted together within the chuck and the assembly is spring-loaded against the back of the stop plate 70. The stop plate 70 has a plurality of dowel pins 71 and push off springs 72. The dowel pins 71 align with corresponding holes in a chuck assembly 60. In addition, the stop plate 70 has a stop plate opening 73. As seen in FIG. 6, the retainer 10 and interposer 20 extend through the stop plate opening. The purpose of the push-off springs 72 in the stop plate 70 is to assure that the device under test does not stick to the interposer 20 when the chuck assembly 60 drops off a carrier (not shown).

According to one embodiment of the present invention, during installation, an interface sealant 30 is applied to the back of the interposer 20, preferably along the periphery of the back of the interposer 20. The interface sealant 30 is applied to the interposer so that it forms a perimeter near the edges of the interposer. An interface material 40 is applied to the bottom surface of the interposer 20 inside the perimeter formed by the interface sealant 30. According to another embodiment of the present invention, the interface sealant 30 is placed on the surface of the thermal unit 50.

According to another embodiment of the present invention, the interface sealant 30 is positioned in the variable gland 25 of an interposer 20. Preferably, the interface sealant 30 is an O-ring. The O-ring forms the perimeter of the interface medium chamber 80. An interface material 40 is positioned on the bottom surface of the interposer 20 within the perimeter formed by the O-Ring.

Figure 2B:
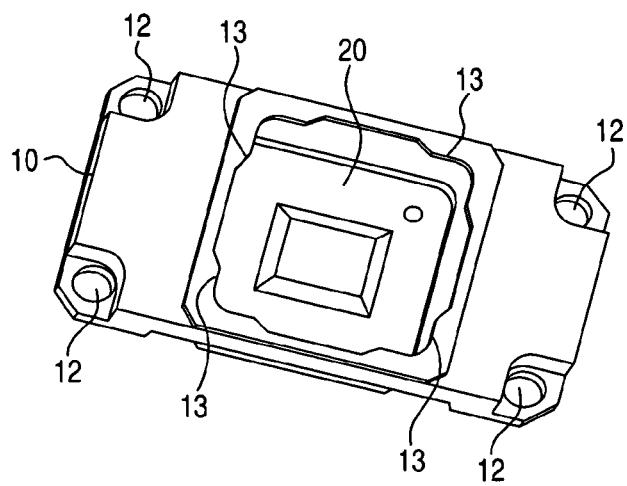
FIG. 2B is a front perspective view of a retainer and interposer, according to one embodiment of the present invention, for a heat sink pedestal device.
Figure 2C:
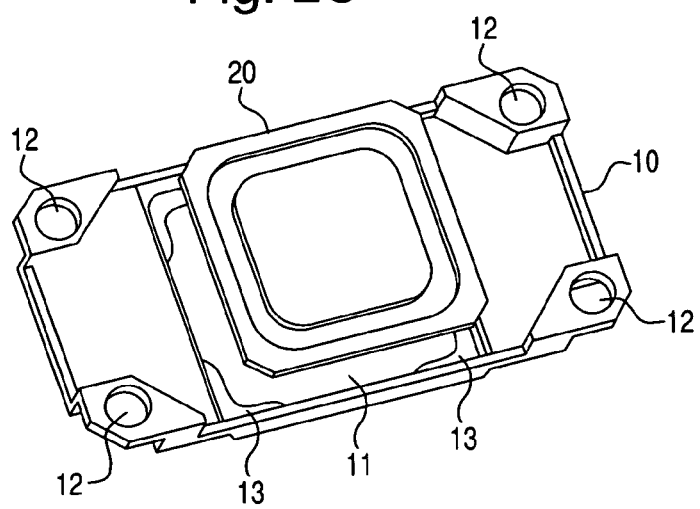
FIG. 2C is back perspective view of a retainer and an interposer, according to one embodiment of the present invention, for a heat sink device.
Figure 2D:
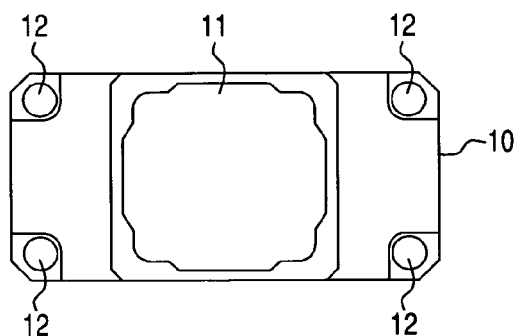
FIG. 2D is a front view of a retainer according to one embodiment of the present invention.
Figure 2E:
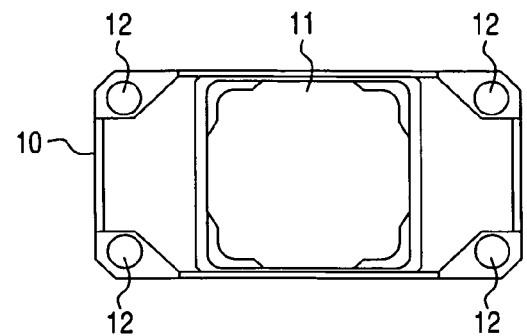
FIG. 2E is back view of a retainer according to one embodiment of the present invention.
Figure 2F:
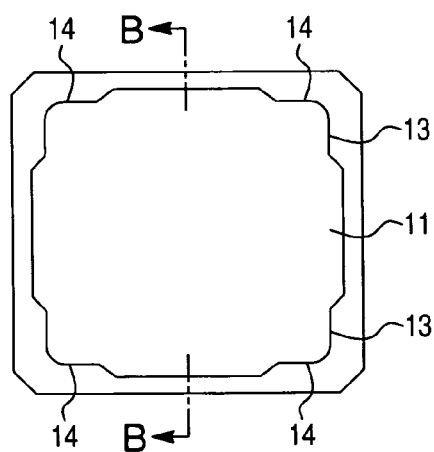
FIG. 2F is an enlarged front view of the retainer's mating surface and mating edge.
Figure 2G:
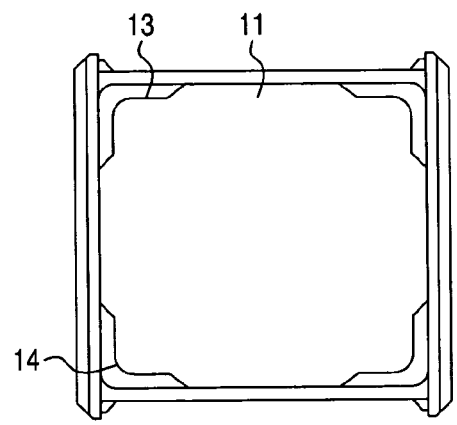
FIG. 2G is an enlarged back view of the retainer's mating surface and mating edge.
Figure 2H:
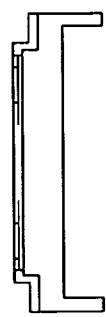
FIG. 2H is an enlarged perspective view of the retainer's mating surface and edge along section B.
Figure 2I:
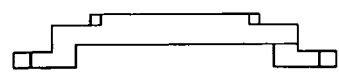
FIG. 2I is a side view of a retainer for a heat sink pedestal device according to one embodiment of the present invention.

As shown in FIGS. 2B-2C, the retainer is configured to hold and secure the position of the interposer 20. During installation, as shown in FIG. 2C, the interposer 20 is laid in the retainer 10. A plurality of screw heads (not shown) attached to the thermal unit 50 are fit through the screw holes 12 of the retainer 10. The retainer 10 is configured so that the interposer 20 fits securely in the retainer opening 11 so that the interposer 20 extends through the retainer opening 11.

The interface sealant 30 is fastened in between the interposer 20 and the thermal unit 50 whereby an interface medium chamber 80 (not shown) is formed between the interposer 20 and the thermal unit 50. The interface material 40 is positioned within the interface medium chamber 80. The interface medium chamber 80 assures the best possible thermal interface between the thermal unit 50 and the interposer 20. The interface medium chamber 80 controls the location and amount of the interface material 40, thus assuring a consistent interface. The size of the interface medium chamber 80 can be increased or decreased as required.

As shown in FIG. 6, a stop plate 70 is mounted over the retainer 10. The stop plate 70 has a stop plate opening 73 such that the retainer 10 and interposer 20 extend through the stop plate opening 73. As seen in FIGS. 7A-8B the heat sink pedestal device as assembled has an interface medium chamber 80 formed by the interface sealant 30, the interposer 20 and the thermal unit 50.

According to certain aspects of the present invention, several advantages are realized. One advantage is that the heat sink pedestal device, via the interface medium chamber 80 maximizes heat transfer between a thermal unit, such as a heat sink, and a unit to be thermally conditioned. In addition, the heat sink pedestal device minimizes customization because it allows a "generic" heat sink or thermal unit assembly (i.e., heat sinks of different sizes and types) to be used to accommodate a wide range of unit sizes. This can be accomplished, for example, by changing the area of the surface of the pedestal contacting the device. Thus, different devices may be handled without changing the thermal unit, for example, by changing the heat pedestal device.

The foregoing description illustrates various aspects, features and advantages of the invention. Among other features, the invention provides an interface medium chamber that provides a high thermally conductive interface between the interposer and a thermal unit.

Given the disclosure of the present invention, one versed in the art would appreciate that there may be other embodiments and modifications within the scope and spirit of the invention. Accordingly, all modifications attainable by one versed in the art from the present disclosure within the scope and spirit of the present invention are to be included as further embodiments of the present invention. The scope of the present invention is to be defined as set forth in the following claims.

What is claimed is:

1. A heat sink pedestal device for use with a thermal unit comprising:
   an interposer, having a pedestal configured to contact a unit under test;
   an interface medium chamber, compressed between the interposer and the thermal unit, wherein an interface sealant defines a perimeter of the interface medium chamber; and
   a retainer, holding the interposer and mounted to the thermal unit, having a retainer opening for allowing the pedestal to extend through the retainer opening to contact the unit under test.

2. The heat sink pedestal device of claim 1, wherein the interface medium chamber further comprises:
   an interface material located within the perimeter of the interface medium chamber.

3. The heat sink pedestal device of claim 1, wherein the pedestal has a raised contact surface for contacting the device under test.

4. The heat sink pedestal device of claim 3, wherein the surface area of the raised contact surface is configured to correspond to the surface area of the device under test.

5. The heat sink pedestal device of claim 3, wherein the surface area of the raised contact surface is configured to correspond to less than one hundred percent of the surface area of the device under test, such that the edges of the device under test are avoided and the contact area is otherwise maximized.

6. The heat sink pedestal device of claim 1, wherein the interposer is composed of material having a high thermal conductivity.

7. The heat sink pedestal device of claim 1, wherein the interface sealant is fastened to a surface of the thermal unit.

8. The heat sink pedestal device of claim 7, wherein the interface material is compressed between the thermal unit and the interposer, and is positioned inside the interface sealant.

9. The heat sink pedestal device of claim 1, wherein the interface sealant is fastened to a surface of the interposer opposite the pedestal.

10. The heat sink pedestal device of claim 9, wherein the interface material is compressed between the interposer and the thermal unit, and is positioned inside the interface sealant.

11. The heat sink pedestal device of claim 1, wherein the interface sealant is composed of a pliant material.

12. The heat sink pedestal device of claim 1, wherein the interface material is composed of a thermal compound.

13. The heat sink pedestal device of claim 1, wherein the retainer comprises a mating surface for retaining the interposer in the Z-axis.

14. The heat sink pedestal device of claim 1, wherein the interposer is securely retained in X and Y axes by a precision fit between the retainer opening and a plurality of bosses located on the interposer.

15. The heat sink pedestal device of claim 1, further comprising:
   a stop plate having a stop plate opening, mounted to a chuck assembly, whereby the retainer and interposer extend through the stop plate opening.

16. The heat sink pedestal device of claim 15, wherein the stop plate further comprises:
   a plurality of dowel pins for mounting the stop plate to the chuck assembly; and
   a plurality of push-off springs.

17. A heat sink pedestal device for use with a thermal unit mounted to a chuck assembly comprising:
   an interposer comprising:
   a pedestal configured to contact a unit under test, and
   a variable gland, positioned on a periphery of an interposer surface opposite the pedestal;
   an interface sealant positioned in the variable gland to define an interface medium chamber between the interposer and the thermal unit,
   an interface material located within the interface medium chamber; and a retainer, holding the interposer in compression against the thermal unit and mounted to the thermal unit, having a retainer opening for allowing the pedestal to extend through the retainer opening to contact the unit under test.

18. The heat sink pedestal device of claim 17, wherein the pedestal has a raised contact surface for contacting the device under test.

19. The heat sink pedestal device of claim 17, wherein the interface sealant is an O-ring.

20. The heat sink pedestal device of claim 17, wherein the interface material is composed of a thermal compound.

21. The heat sink pedestal device of claim 17, wherein the retainer comprises a mating surface for retaining the interposer in the Z-axis and wherein the interposer is securely retained in a X and Y axis by a precision fit between the retainer opening and a plurality of bosses located on the interposer.

22. The heat sink pedestal device of claim 17, further comprising a stop plate having a stop plate opening, mounted to the chuck assembly, whereby the retainer and interposer extend through the stop plate opening.

* * * * *

UNITED STATES PATENT AND TRADEMARK OFFICE
CERTIFICATE OF CORRECTION

PATENT NO. : 7,639,029 B2
APPLICATION NO. : 11/331217
DATED : December 29, 2009
INVENTOR(S) : Wetzel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 376 days.

Signed and Sealed this

Ninth Day of November, 2010

David J. Kappos
*Director of the United States Patent and Trademark Office*